United States Patent [19]

Duchateau et al.

[11] Patent Number: 5,302,552
[45] Date of Patent: Apr. 12, 1994

[54] METHOD OF MANUFACTURING A SEMICONDUCTOR DEVICE WHEREBY A SELF-ALIGNED COBALT OR NICKEL SILICIDE IS FORMED

[75] Inventors: Johan P. W. B. Duchateau; Alec H. Reader, both of Eindhoven; Gerrit J. Van Der Kolk, Maarheeze, all of Netherlands

[73] Assignee: U.S. Philips Corporation, New York, N.Y.

[21] Appl. No.: 38,045

[22] Filed: Mar. 26, 1993

Related U.S. Application Data

[63] Continuation of Ser. No. 840,367, Feb. 24, 1992, abandoned.

[30] Foreign Application Priority Data

Feb. 26, 1991 [NL] Netherlands ............... 9100334

[51] Int. Cl.$^5$ ......................................... H01L 21/283
[52] U.S. Cl. .................................. 437/200; 437/201; 437/984; 148/DIG. 19; 148/DIG. 147
[58] Field of Search ............... 437/192, 190, 200, 201, 437/22, 984; 148/DIG. 140, DIG. 19, DIG. 147; 257/768, 764, 769

[56] References Cited

U.S. PATENT DOCUMENTS

| | | | |
|---|---|---|---|
| 3,887,993 | 6/1975 | Okada et al. | 437/202 |
| 4,912,061 | 3/1990 | Nasr | 437/44 |
| 5,047,367 | 9/1991 | Wei et al. | 437/200 |

OTHER PUBLICATIONS

Hung, L. S., et al., "Interaction of Amorphous ...", *J. Appl. Phys.*, 59(7), Apr. 1986, pp. 2416–2421.

Rastogi, R. S., et al., "Interaction of Amorphous ...", *J. Appl. Phys.*, 67(4), Feb. 15, 1990, pp. 1868–1873.
Murarka, S. P., Silicides for VLSI Applications, Academic Press, 1983, pp. 30–37, 168–171.
Wittmer, M., "Barrier Layers: Principles ...", *J. Vac. Sci. Technol.* A2(2), Apr.–Jun. 1984, pp. 273–279.
Tu, K. N., "Shallow and Parallel Silicide Contacts," *J. Vac. Sci. Technol.*, 19(3), Sep./Oct. 1981, pp. 766–777.
Verhaar, R., et al., "Self-Aligned CoSi$_2$ and ...", *Appl. Surface Science*, 38(1989), pp. 458–466.
DeReus, R., et al., "The Crystallization Temperature ...", *Materials Letters*, vol. 9, No. 12, Aug. 1990, pp. 487–493.
European Search Report Appl. No. 92200459.3.

*Primary Examiner*—T. N. Quach
*Attorney, Agent, or Firm*—Steven R. Biren

[57] ABSTRACT

A method of manufacturing a semiconductor device whereby a layer (12) containing Co or Ni is deposited on a surface (2) of a semiconductor body (1) bounded by silicon regions (3, 4, 5, 6) and regions of insulating material (8, 9), after which the semiconductor body (1) is heated during a heat treatment to a temperature at which the Co or Ni forms a metal silicide with the silicon (3, 4, 5, 6), but not with the insulating material (8, 9). On the surface (2) of the layer (12) containing the Co or Ni, according to the invention, a layer of an amorphous alloy of this metal with a metal from a group comprising Ti, Zr, Ta, Mo, Nb, Hf and W is deposited, while furthermore the temperature is so adjusted during the heat treatment that the layer (12) of the amorphous alloy remains amorphous during the heat treatment. In this way a metal silicide is formed on the silicon regions (3, 4, 5, 6) only and not on the regions of insulating material (8, 9) directly adjoining them; in other words, the method yields a self-aligned metal silicide.

7 Claims, 1 Drawing Sheet

METHOD OF MANUFACTURING A SEMICONDUCTOR DEVICE WHEREBY A SELF-ALIGNED COBALT OR NICKEL SILICIDE IS FORMED

This is a continuation of application Ser. No. 07/840,367, filed Feb. 24, 1992, abandoned.

BACKGROUND OF THE INVENTION

The invention relates to a method of manufacturing a semiconductor device whereby a layer comprising Co or Ni is deposited on a surface of a semiconductor body which is bounded by regions of silicon and regions of an insulating material, after which the semiconductor body is heated during a heat treatment to a temperature at which the Co or Ni forming a metal silicide with the silicon, but not with the insulating material.

The silicon regions may be regions of monocrystalline as well as polycrystalline silicon, such as source and drain zones or gate electrodes of field effect transistors. The regions of insulating material may be used for insulating field effect transistors from one another or for lateral insulation of gate electrodes. They may be made of silicon oxide, nitride, or oxynitride.

After the heat treatment, any remaining Co or Ni may be selectively etched away relative to the insulating material and the silicide formed. The silicide then remains as a top layer on the silicon. The silicon has thus been provided with a highly conductive top layer in a self-registering manner.

Co and Ni silicides have the advantage that they possess the same crystal structure with practically the same dimensions as silicon, so that few mechanical stresses will arise in monocrystalline silicon upon the formation of the metal silicide. In addition, these metal silicides have a great resistance to etchants with which silicon oxide can be etched. As a result, silicon regions having a top layer of these metal silicides may be readily provided with an insulating layer of silicon oxide which has contact holes for local contacting of these regions.

A method of the kind mentioned in above is known from "Self-aligned CoSi$_2$ and TiW(N) local interconnect in a sub-micron CMOS process", R. D. J. Verhaar et al., Appl. Surf. Sci., 38 (1989), pp. 458–466, whereby a layer of Co is provided on a semiconductor body having a surface bounded by regions of monocrystalline silicon, polycrystalline silicon, and silicon oxide. The semiconductor body is brought to a temperature of between 500° and 900° C. within a few seconds after the Co layer has been provided, and kept at this temperature for 30 seconds. Then Co is etched away from the surface and a second heat treatment at a temperature of 700° C. is carried out for 30 seconds.

It was found to be practically impossible to provide a layer of CoSi$_2$ by the known process described without "overgrowth" occurring, by which is meant that the growth of the metal silicide is not limited to the silicon regions, but that it also extends to on the silicon oxide regions situated immediately next to the silicon regions. Such an overgrowth may give rise to short-circuits in the semiconductor device.

SUMMARY OF THE INVENTION

The invention has for its object inter alia to provide a method by which silicon regions present at a surface of a semiconductor body can be provided with a layer of Co or Ni silicide, while the overgrowth described above is substantially avoided.

To achieve this object, the method according to the invention is characterized in that as the Co- or Ni-containing layer a layer of an amorphous alloy of this metal and a metal from a group comprising Ti, Zr, Ta, Mo, Nb, Hf and W is deposited on the surface and in that the temperature is so adjusted during the heat treatment that the layer of the amorphous alloy remains amorphous during the heat treatment.

The said overgrowth is substantially avoided by this. The suspected cause is that Co or Ni is provided in a layer which is amorphous. According to the known method described, the metal is provided in a layer comprising only Co. Such a layer is crystalline. If this layer is made to react with silicon regions of a semiconductor body through heating, overgrowth will be possible because Si atoms can diffuse from the silicon regions along crystal boundaries into the metal layer during the heat treatment, and form silicide there. An amorphous layer, on the other hand, has no crystal boundaries, so that diffusion of silicon atoms from the semiconductor regions into the layer comprising Co or Ni is practically impossible. The amorphous alloy as used in the method according to the invention yields Co or Ni during the heat treatment and remains amorphous during this, so that overgrowth is avoided throughout the heat treatment.

Preferably, the method according to the invention is characterized in that a layer of an amorphous alloy of Co with a metal from the group Ti, Zr and W is deposited on the surface. Co silicide has a lower electrical resistance than Ni silicide (18 and 50 micro-ohms cm, respectively), so that a less thick Co silicide layer need be used compared with an Ni-silicide layer in order to obtain a layer of metal silicide having a desired square resistance. Ti, Zr and W are particularly suitable materials for the layer because of the ready availability of these metals in the semiconductor production process, while these metals give satisfactory results in practice.

Although formation of Co and Ni silicides takes place above approximately 300° C., the temperature during the heat treatment is preferably chosen to be between 350° and 600° C. Above 600° C., formation of silicides with the metal from the group with Ti, Zr, Ta, Mo, Nb, Hf and W takes place. Such a formation is undesirable because of, for example, mechanical stresses which may arise in the metal silicide. A temperature between 350° and 600° C. gives a sufficiently fast reaction between Co or Ni and silicon, while formation of silicide with the other metal from the alloy does not take place.

It is important for the layer comprising Co or Ni to remain amorphous during the heat treatment. The amorphous layer may crystallize above a certain temperature, the crystallization temperature. This temperature depends on the ratio of Co or Ni to the metal from the group. The Co or Ni reacts with silicon to form the desired metal silicide. The Ti, Zr or W serves to make the alloy amorphous. Preferably, an alloy containing between 50 and 75 at % Co is deposited. In the case of Co and W, the crystallization temperature of an alloy containing approximately 50 to 75 at % Co is well above 600° C., so that no crystallization will take place during implementation of the method, also if Co should be diffused out.

In semiconductor devices having very small detail dimensions (VLSI), conductors may advantageously be used which lie directly over regions of an insulating material. In the method according to the invention, the remaining portion of the amorphous alloy layer which has formed no metal silicide with the silicon is preferably patterned after the heat treatment. Conducting amorphous material is still present on the regions of insulating material and on the metal silicide formed after the formation of this metal silicide. This is fabricated into the correct pattern by means of usual techniques such as photolithography, etching, etc., in order to form the conductor tracks. To obtain a comparatively low electrical resistance of the conductor track, the remaining portion of the layer is preferably nitrided after this portion has been patterned. Nitriding takes place by, for example, heating of the device in an atmosphere of $NH_3$ or $N_2$. Thus low-ohmic conductor tracks are formed over the regions of insulating material in a simple manner by means of the layer which is already present and which comprises amorphous metal.

Preferably, a layer of an amorphous alloy is used which is provided with boron during the deposition, while the heat treatment takes place in an atmosphere containing nitrogen. The boron atoms from the amorphous layer diffuse into the silicon surface during the heat treatment and thus form a p-type doped region. The nitrogen from the atmosphere reacts with the metal from the group Ti, Zr, Ta, Mo, Nb, Hf and W to form a metal nitride. This metal nitride forms a layer on the metal silicide, so that the boron cannot disappear through a surface of the layer. In this way a silicide and a p-type doped region can be formed in a self-registering manner at the same time.

BRIEF DESCRIPTION OF THE DRAWING

The invention is explained in more detail below, by way of example, with reference to drawing. In the drawing.

The Figures are purely diagrammatical and not drawn to scale. Corresponding parts are generally indicated with the same reference numerals in the Figures.

DESCRIPTION OF THE PREFERRED EMBODIMENTS

Figure 1:
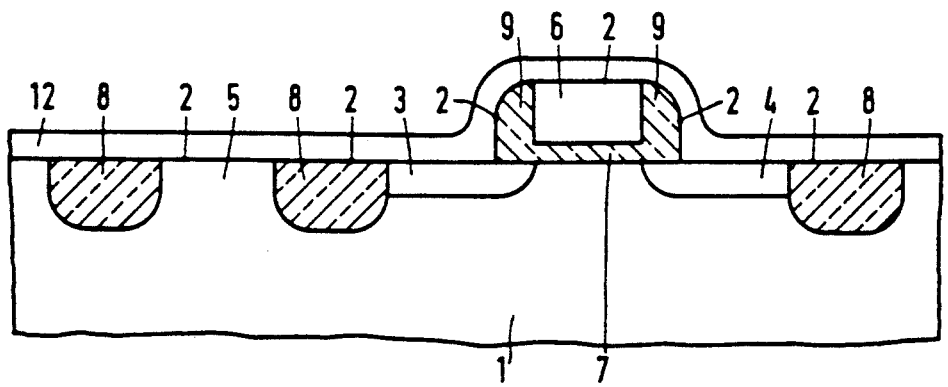
FIGS. 1 and 2 show two stages in the manufacture of a semiconductor device made by the method according to the invention and FIG. 3 shows a test device for detecting overgrowth of metal silicide over regions of insulating material.
Figure 2:
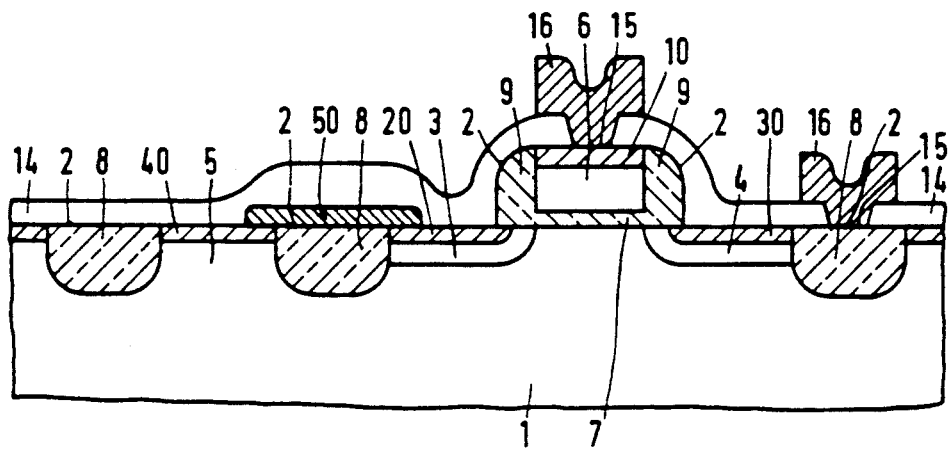

FIGS. 1 and 2 show a cross-section of a semiconductor device, the manufacture of which by the method according to the invention will be described. The semiconductor device comprises a semiconductor body 1 with a surface 2 bounded by silicon regions 3, 4, 5 and 6 and regions of insulating material 8 and 9 (see FIG. 1). The regions 3, 4 and 5 are of monocrystalline silicon. The regions 3 and 4 in this example form the drain and source zones of a field effect transistor. The semiconductor body 1 may be contacted, for example, through the region 5. The silicon region 6 is of polycrystalline silicon and forms the gate electrode of the field effect transistor, insulated by a layer of gate oxide 7 from the portion of the semiconductor body 1 situated between the source and drain zones 3 and 4. The regions of insulating material 8 and 9 in this example consist of silicon oxide, but they might alternatively be made of silicon nitride, silicon oxynitride, or even of aluminum oxide. The insulating regions 8 insulate the source and drain zones 3, 4 of the region 5, acting as field oxide regions. The insulating regions 9 insulate the gate electrode 6 in lateral direction from the source and drain zones 3 and 4.

A layer 12 comprising Co or Ni is deposited on the surface 2 of the semiconductor body 1, after which the semiconductor body 1 is heated in a heat treatment to a temperature at which the Co or Ni forms metal silicide 10, 20, 30 and 40 with the silicon 3, 4, 5 and 6, but does not form metal silicide with the insulating material 8 and 9, the temperature being furthermore so adjusted during the heat treatment that the layer of the amorphous alloy remains amorphous during the heat treatment. After the heat treatment, remaining Co or Ni may be selectively etched away from the layer 12 relative to the insulating material 8 and 9 and the formed metal silicide 10, 20, 30 and 40 (see FIG. 2). The metal silicide 10, 20, 30 and 40 thus remains as a top layer on the silicon 3, 4, 5 and 6. The monocrystalline silicon regions 3, 4, 5 can be better contacted in this way, while the polycrystalline region 6 exhibits a lower electrical resistance.

Co and Ni silicides have the advantage that they have the same crystal structure with practically the same dimensions as silicon, so that few mechanical stresses will arise during the formation of the metal silicide in monocrystalline silicon. In addition, these metal silicides have a great resistance to etchants with which silicon oxide can be etched. As a result, the silicon regions 3, 4, 5 and 6 with metal silicide top layer 10, 20, 30 and 40 may be simply provided with an insulating layer 14 of silicon oxide having contact holes 15 for local contacting of these regions, for example, by means of an aluminum layer 16.

According to the invention, a layer of an amorphous alloy of Co or Ni with a metal from a group comprising Ti, Zr, Ta, Mo, Nb, Hf and W as the layer 12 comprising Co or Ni is deposited on the surface 2, the temperature furthermore being so adjusted during the heat treatment that the layer of the amorphous alloy remains amorphous during the heat treatment. The formation of metal silicide on portions of the regions of insulating material 8 and 9 immediately adjoining the silicon regions, the so-called overgrowth, is prevented by the measure according to the invention. The suspected cause is that Co or Ni is provided in a layer which is amorphous. An amorphous layer has no crystal boundaries, so that diffusion of silicon atoms from the semiconductor regions into the layer comprising Co or Ni is practically impossible, so that overgrowth is avoided throughout the heat treatment.

Co, Ni, and the metal from the group Ti, Zr, Ta, Mo, Nb, Hf and W may be deposited on the conductor body in usual manner, for example, by sputtering or vapor deposition. In the latter case the metal is heated, for example, with an electron beam.

Preferably, the method according to the invention is characterized in that a layer of an amorphous alloy of Co with a metal from the group Ti, Zr and W is deposited on the surface. Co silicide has a lower electrical resistance than Ni silicide (18 and 50 micro-ohms cm, respectively), so that a less thick layer of Co silicide need be used compared with a layer of Ni silicide in order to obtain a metal silicide layer having a desired square resistance. Ti, Zr and W are particularly suitable metals for the layer because of the ready availability of these metals in the semiconductor production process, while these metals give satisfactory results in practice.

Preferably, the semiconductor body 1 is heated to a temperature between 350° C. and 600° C. during the heat treatment of the amorphous alloy. Below 350° C.

the formation of silicide is not fast enough, so that only a thin metal silicide layer is generated after a long process time, while above 600° C. not only the Co or Ni, but also the metal from the group comprising Ti, Zr, Ta, Mo, Nb, Hf and W reacts with the silicon 3 and 4. Such a reaction is undesirable because of, for example, mechanical stresses which may arise in the metal silicide. A temperature between 350° and 600° C. gives a sufficiently fast reaction of the layer 12 comprising amorphous Co or Ni with the silicon regions 3, 4, 5 and 6, while the formation of silicide with the metal from the group does not happen. Preferably, therefore, the temperature is taken to be between 350° and 600° C. during the heat treatment.

It is important for the layer comprising Co or Ni to remain amorphous during the heat treatment. The amorphous layer may crystallize above a certain temperature, the crystallization temperature. The crystallization temperature of the amorphous alloy lies above the temperature at which the heat treatment is carried out in the method according to the invention. The crystallization temperature depends on the ratio of Co or Ni to the metal from the group. This ratio is discussed in more detail in "The Crystallization Temperature of Amorphous Transition-Metal Alloys" by R. de Reus et al. in Materials Letters, vol. 9, No. 12, August 1990, pp. 487-493. An alloy is preferably chosen which contains a maximum amount of Co or Ni in order to obtain the thickest possible metal silicide layer, while the crystallization temperature is well above the heat treatment temperature. Preferably, an alloy comprising between 50 and 75 at % Co is deposited. The crystallization temperature is above 600° C. for this composition, also when the Co content of the alloy decreases owing to diffusion of Co. For $Co_{70}Ti_{30}$, i.e. an alloy containing 70 at % Co and 30 at% Ti, and for CoZr with between 50 and 90% Co, the crystallization temperature is also above 600° C.

In semiconductor devices having very small detail dimensions (VLSI), it is often necessary to interconnect electrically several conductor tracks, such as, for example, the metal silicide regions 20 and 40. These connector tracks are normally physically separated and electrically insulated by regions of insulating material, for example, a region 8. To connect the conductor tracks 20 and 40 with one another, a conductor track 50 is laid over the region of insulating material 8. In the method according to the invention, preferably, the remaining portion of the layer of amorphous alloy 12, which has not formed a metal silicide with the silicon, is brought into a pattern after the heat treatment. After the formation of the metal silicide 10, 20, 30 and 40, the amorphous layer 12 is still present on the regions of insulating material 8 and 9 and above the metal silicide formed. The amorphous layer 12 is patterned by means of usual techniques such as photolithography, etching, etc., to form the conductor track 50. To obtain a comparatively low electrical resistance of the conductor track 50, this portion is preferably nitrided after the remaining portion of the layer has been patterned. This nitriding takes place, for example, by heating the device in an atmosphere of $NH_3$ or $N_2$. Thus a low-ohmic conductor track 50 is formed over a region of insulating material 8 in a simple manner by means of the layer 12 comprising amorphous metal which was already present.

Preferably, a layer of an amorphous alloy 12 is used which is provided with boron during deposition, while the heat treatment takes place in an atmosphere containing nitrogen. The boron atoms from the amorphous layer 12 diffuse into the silicon surface during the heat treatment and thus form a p-type doped region, for example, regions 3 and 4. The nitrogen from the atmosphere reacts with the metal from the group Ti, Zr, Ta, Mo, Nb, Hf and W to form a metal nitride. This metal nitride forms a layer on the metal silicide, so that the boron cannot disappear through a surface of the layer. In this way a silicide 10, 20, 30 and 40 and p-type doped regions 3 and 4 can be formed in a self-aligned manner and at the same time.

A number of examples of the method according to the invention will be given in the section below.

EXAMPLE 1

Figure 3:
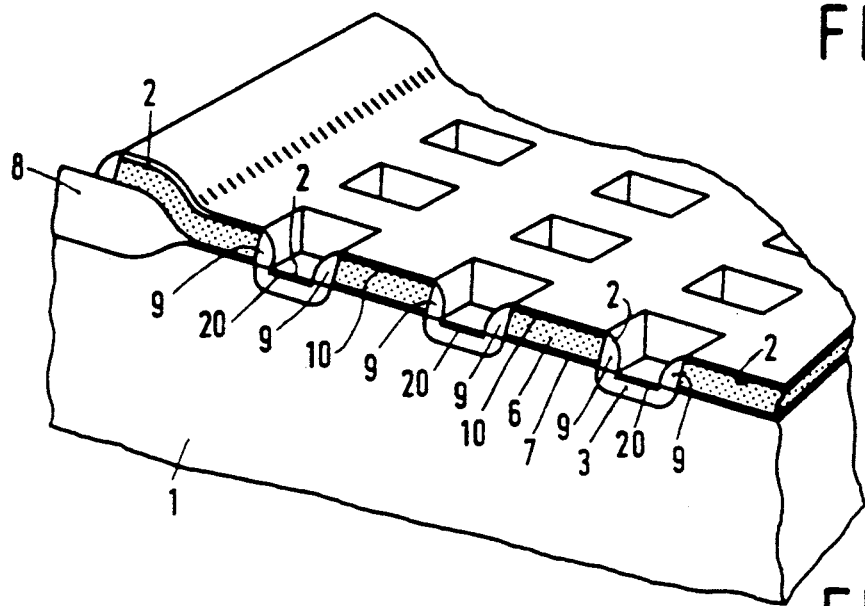

Formation of Self-registering Cobalt Silicide from an Amorphous $Co_{75}W_{25}$ Layer A semiconductor body 1 is provided with silicon regions 3, 4, 5 and 6 and regions of insulating material 8 and 9 in usual manner. Then Co and W are provided by sputtering (vacuum $7 \times 10^{-7}$ torr, pressure during sputtering $5 \times 10^{-3}$ torr deposition rate 0.84 nm/s). This is followed by a first heat treatment in a vacuum of $8 \times 10^{-7}$ torr, after which etching takes place with $NH_3:H_2O_2$ 1:1 during two minutes. A second heat treatment is then carried out at 750° C. for 15 minutes. The temperatures and treatment times during the first heat treatment, the measured layer thickness, the square resistance $R_\blacksquare$ before and after etching, the square resistance and the layer thickness after the second heat treatment are given in Table 1. The layers were then inspected by means of transmission electron microscopy (TEM), Rutherford backscattering (RBS) and Auger spectroscopy. No overgrowth of the metal silicide on the regions of insulating material was found. Overgrowth was also investigated by means of a special test semiconductor device drawn in FIG. 3, in which metal silicide layers 10 and 20 are formed on a surface 2 of a semiconductor body 1, which layers are separated by a thin region of silicon oxide 9. The electrical resistance between the two metal silicide regions 10 and 20 is a measure for the overgrowth. In this test device, again, no overgrowth was found.

Table 1: Layer thickness after sputtering, temperature and treatment time of first heat treatment, square resistance $R_\blacksquare$ before and after etching, and square resistance and layer thickness after the second heat treatment for $Co_{75}W_{25}$.

| 1st heat treatment [°C., min.] | $R_\blacksquare$ after etching [Ω/■] | $R_\blacksquare$ after etching [Ω/■] | $R_\blacksquare$ after 2nd heat treatment [Ω/■] | Layer thickness 2nd heat treatment [nm] |
|---|---|---|---|---|
| 500° C., 300' | 7,6 | 18,6 | | |
| 550° C., 30' | 6,3 | 26 | 14 | 22 |
| 550° C. 120' | 5,5 | 13 | 4,6 | 51,5 |
| 600° C. 15' | 5,3 | 17 | 6,8 | 40,3 |
| 600° C. 45' | 6,0 | 11,2 | 2,9 | 77,2 |

EXAMPLE 2

Formation of Cobalt Silicide or Nickel Silicide from an Amorphous Layer of Co or Ni with Zr, W, or Ti A semiconductor body 1 is provided with silicon regions 3, 4, 5 and 6 and regions of insulating material 8 and 9 in usual manner. Then an amorphous layer is provided by vapor deposition (vacuum $7\times10^{-7}$ torr). A first heat treatment then follows in a vacuum of $8\times10^{-7}$ torr, after which etching takes place with $NH_3:H_2O_2$ 1:1 during two minutes. A second heat treatment is then carried out, if so desired. The composition, layer thickness after vapor deposition, temperature and treatment time during the first heat treatment, square resistance R▪ before and after etching, temperature and time of the second heat treatment, square resistance and layer thickness after the second heat treatment are given in Table 2. The layers were then inspected by means of transmission electron microscopy (TEM), Rutherford backscattering (RBS) and Auger spectroscopy. No overgrowth of the metal silicide on the regions of insulating material was found. Overgrowth was also investigated with the special test semiconductor device of FIG. 3. In the metal silicide layers made in this example 2, again, no overgrowth was found with this test device.

Table 2: Composition, layer thickness after vapor deposition, temperature and treatment time during first heat treatment, square resistance R▪ before and after etching, temperature and time of second heat treatment (if any), square resistance R▪ and layer thickness after first or second heat treatment.

| Composition | Layer thickness [nm] | 1st heat treatment [°C., min.] | R▪ before etching [Ω/▪] | R▪ after etching [Ω/▪] | 2nd heat treatment [°C., min] | R▪ after 2nd heat treatment [Ω/▪] | Layer thickness after heat treatment [nm] |
|---|---|---|---|---|---|---|---|
| $Co_{80}$—$Zr_{20}$ | 50 | 500° C., 60' | 7 | 9 | | | 50 |
| $Co_{65}$—$W_{35}$ | 50 | 550° C., 15' | 12 | 2,7 | | | 20 |
| $Co_{60}$—$W_{40}$ | 50 | 500° C., 120' | 12 | 25 | | | 8,5 |
| $Co_{60}$—$W_{40}$ | 50 | 450° C., 1440' | | | | | 15 |
| $Co_{60}$—$W_{40}$ | 100 | 575° C., 60' | | 4,3 | | | 35 |
| $Co_{70}$—$Ti_{30}$ | 50 | 500° C., 60' | 6,5 | 9 | 600° C., 15' | 6 | 31 |
| $Co_{70}$—$Ti_{30}$ | 50 | 550° C., 60' | 5,8 | 4,9 | 650° C., 15' | 6,2 | 47 |
| $Ni_{40}$—$Zr_{60}$ | 40 | 500° C., 120' | 12,5 | | | | 40 |

EXAMPLE 3

Formation of Cobalt Silicide or Nickel Silicide from an Amorphous Layer of Co or Ni with Ti, Ta, Mo, Nb, Hf and W An amorphous metal layer was provided on the semiconductor body in these examples in the same way as in examples 1 and 2. Metal silicides were obtained in a self-aligned manner under conditions comparable to those given in Tables 1 and 2.

I claim:

1. A method of manufacturing a semiconductor device whereby a layer comprising a metal from a group consisting of Co and Ni is deposited on a surface of a semiconductor body which is bounded by regions of silicon and regions of an insulating material, after which the semiconductor body is heated during a heat treatment to a temperature at which the Co or Ni forms a metal silicide with the silicon, but not with the insulating material, wherein the Co- or Ni- containing layer comprises an amorphous alloy of this metal and a metal from a group consisting of Ti, Zr, Ta, Mo, Nb, Hf and W and the temperature is adjusted during the heat treatment such that the layer of the amorphous alloy remains amorphous during the heat treatment, and the metal silicide is formed in a self-aligned manner only on the silicon, and not on the insulating material.

2. A method as claimed in claim 1, characterized in that a layer of an amorphous alloy of Co with a metal from the group consisting of Ti, Zr and W is deposited on the surface.

3. A method as claimed in claim 2, characterized in that an alloy containing between 50 and 75 at % Co is deposited.

4. A method as claimed in claim 1, characterized in that the temperature during the heat treatment is chosen to be between 350° and 600° C.

5. A method as claimed in claim 1 characterized in that the remaining portion of the layer of the amorphous alloy which has formed no metal silicide with the silicon is patterned after the heat treatment.

6. A method as claimed in claim 5, characterized in that after the remaining portion of the layer has been patterned, this portion is nitrided.

7. A method as claimed in claim 1 characterized in that a layer of an amorphous alloy is used which is provided with boron during the deposition, while the heat treatment takes place in an atmosphere containing nitrogen.

* * * * *